US006919832B2

(12) United States Patent
Brooks

(10) Patent No.: US 6,919,832 B2
(45) Date of Patent: Jul. 19, 2005

(54) METHODS AND SYSTEMS FOR HIGH SPEED QUANTIZERS

(75) Inventor: Todd Lee Brooks, Laguna Beach, CA (US)

(73) Assignee: Broadcom Corporation, Irvine, CA (US)

(*) Notice: Subject to any disclaimer, the term of this patent is extended or adjusted under 35 U.S.C. 154(b) by 70 days.

(21) Appl. No.: 10/668,296

(22) Filed: Sep. 24, 2003

(65) Prior Publication Data

US 2004/0066321 A1 Apr. 8, 2004

Related U.S. Application Data

(63) Continuation of application No. 09/949,810, filed on Sep. 12, 2001, now Pat. No. 6,661,362.
(60) Provisional application No. 60/232,174, filed on Sep. 11, 2000.

(51) Int. Cl.[7] .................................................. H03M 3/00
(52) U.S. Cl. ...................................... 341/143; 341/155
(58) Field of Search ................................ 341/143, 155

(56) References Cited

U.S. PATENT DOCUMENTS

| | | | |
|---|---|---|---|
| 4,968,987 A | 11/1990 | Naka et al. .................. | 341/143 |
| 5,055,846 A | 10/1991 | Welland ...................... | 341/155 |
| 5,404,142 A | 4/1995 | Adams et al. ............... | 341/143 |
| 5,406,283 A | 4/1995 | Leung ......................... | 341/143 |
| 5,684,482 A | 11/1997 | Galton ........................ | 341/144 |
| 5,835,038 A | 11/1998 | Nakao et al. ............... | 341/131 |
| 5,905,453 A | 5/1999 | Kase .......................... | 341/143 |
| 5,982,313 A | 11/1999 | Brooks et al. .............. | 341/143 |
| 6,147,633 A | 11/2000 | Ukawa et al. .............. | 341/143 |
| 6,271,782 B1 | 8/2001 | Steensgaard-Madsen .... | 341/143 |
| 6,661,362 B2 * | 12/2003 | Brooks ........................ | 341/143 |

OTHER PUBLICATIONS

Fogleman, Eric et al., "A 3.3–V Single–Poly CMOS Audio ADC Delta–Sigma Modulator with 98–dB Peak SINAD and 105–dB Peak SFDR," IEEE Journal of Solid–State Circuits, vol. 35, No. 3, Mar. 2000, pp. 297–307.

Delta–Sigma Data Converters Theory, Design, and Simulation, (Steven R. Norsworthy, et al., ed., IEEE Press Marketing) (1997).

Brooks, Todd L., et al., U.S. patent application No. 09/949,807, "Method and Apparatus for Mismatched Shaping of an Oversampled Converter," filed on Sep. 12, 2001.

Brooks, "Methods and Systems for Digital Dither," U.S. application No. 09/949,816, filed Sep. 12, 2001.

* cited by examiner

*Primary Examiner*—Brian Young
(74) *Attorney, Agent, or Firm*—Sterne, Kessler, Goldstein, Fox P.L.L.C.

(57) ABSTRACT

Methods and systems for improved feedback processing in delta-sigma modulators, including single bit and multi-bit delta-sigma modulators, continuous-time and discrete-time delta-sigma modulators, and digital and/or analog feedback loops. One or more processes are performed in a pipeline having a higher throughput rate than a throughput rate of a delta-sigma modulator. Any of a variety of processes and combinations of processes can be performed in the pipeline including, without limitation, quantization, digital signal processing, and/or feedback digital-to-analog conversion.

20 Claims, 18 Drawing Sheets

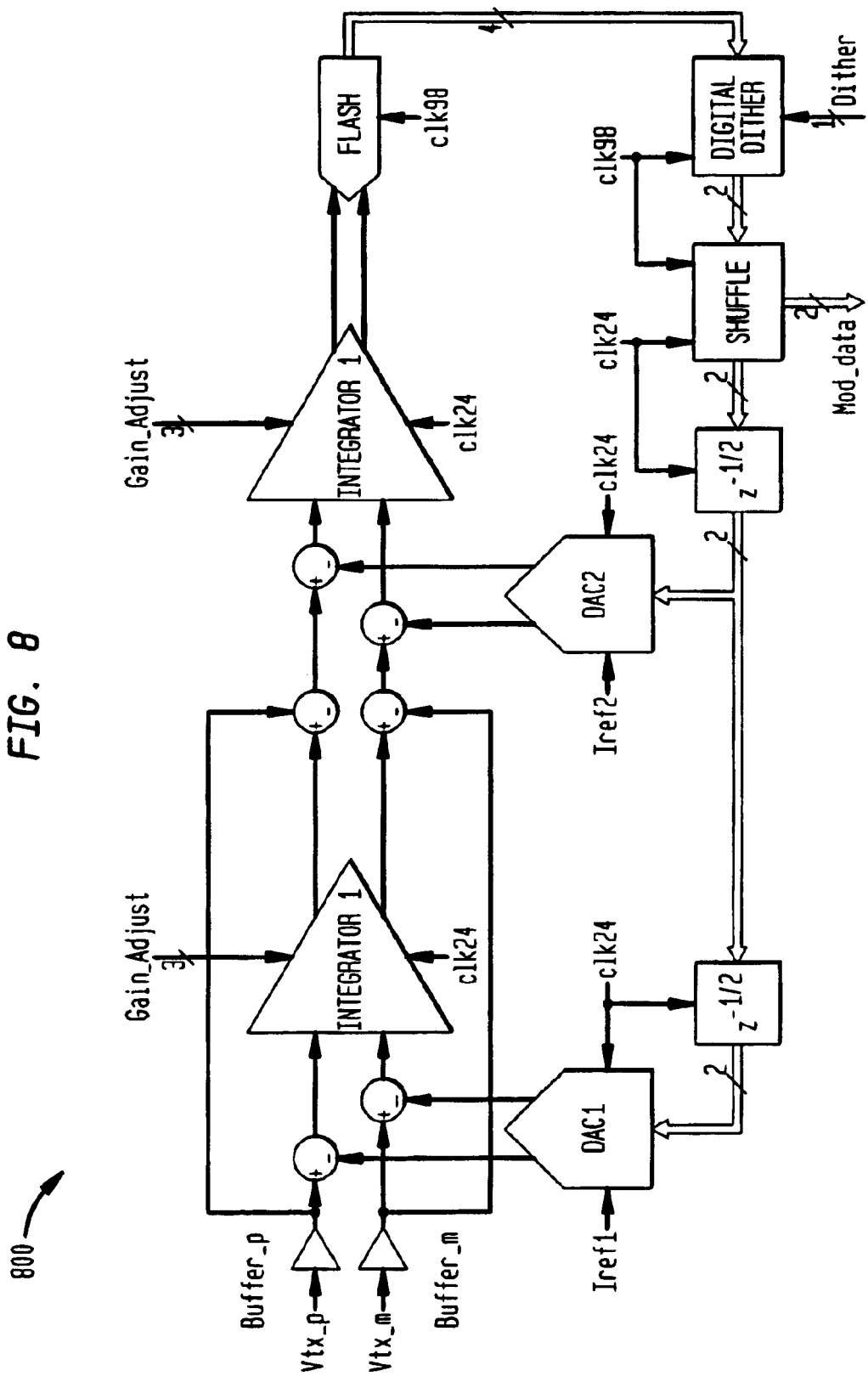

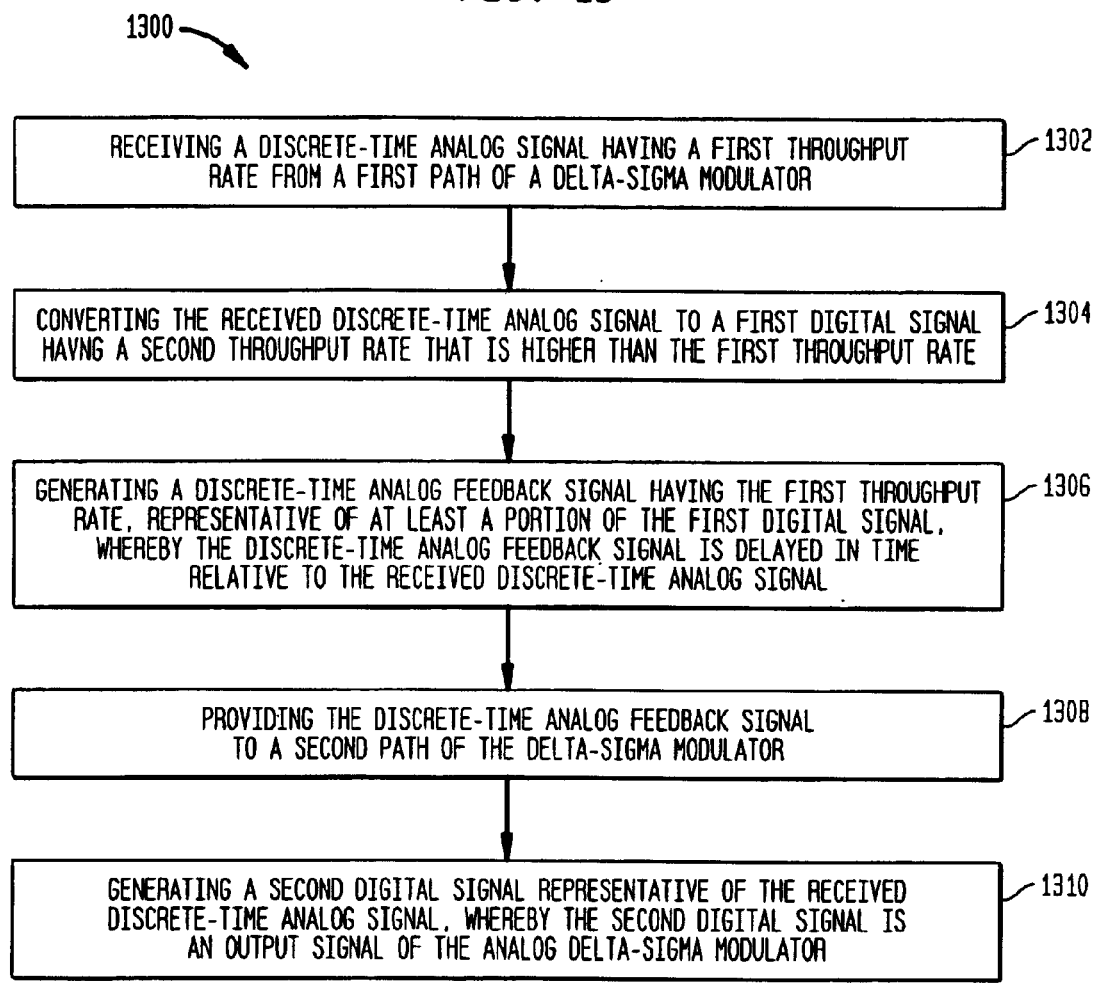

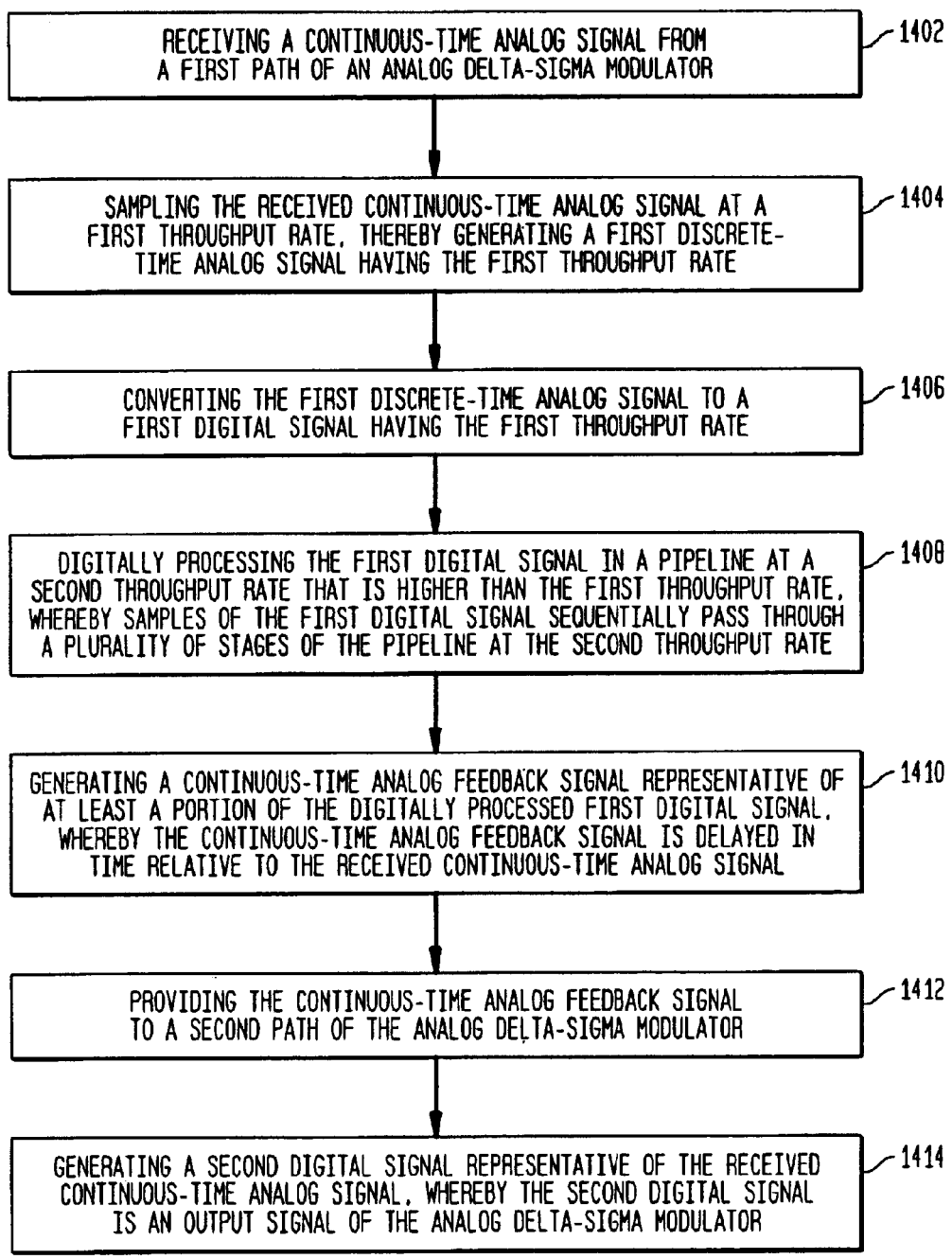

METHODS AND SYSTEMS FOR HIGH SPEED QUANTIZERS

CROSS-REFERENCE TO RELATED APPLICATIONS

This application is a continuation of U.S. patent application Ser. No. 09/949,810, filed Sep. 12, 2001, now U.S. Pat. No. 6,661,362 and entitled "Methods and Systems for High Speed Quantizers," which claims priority to U.S. Provisional Application No. 60/232,174, filed Sep. 11, 2000 and entitled "Multi-bit Analog Delta-Sigma Modulator," each of which are incorporated herein by reference in their entireties.

BACKGROUND OF THE INVENTION

1. Field of the Invention

The invention relates to data converters and, more particularly, to analog-to-digital data converters, multi-bit analog delta-sigma modulators, and feedback processing.

2. Background

Conventional delta-sigma modulators include single bit delta-sigma modulators, multi-bit delta-sigma modulators, continuous time delta-sigma modulators, and discrete-time delta-sigma modulators. Conventional delta-sigma modulators often utilize quantizers and analog and/or digital feedback. A common example of a function implemented in digital feedback circuitry of a multi-bit analog delta-sigma modulator is dynamic element mismatch shaping.

A common problem in the implementation of delta-sigma modulators, such as multi-bit analog delta-sigma modulators, is delay in quantizer and feedback circuitry. Conventional quantizers and feedback loops operate at the same throughput rate as a main path of the delta-sigma modulator. As a result, each process performed by a quantizer and/or feedback loop adds delay to the feedback signal. Delay can degrade stability of the modulator loop and can degrade noise-shaping performance of the modulator loop. This becomes a more difficult problem in a multi-bit, high-speed modulator, especially as more bits are used in the feedback.

In order to reduce delay, conventional delta-sigma modulators utilize quantizers and feedback circuitry with a small number of clock periods of throughput delay. This, however, limits the number of processing steps that can be performed.

In order to increase the number of processing steps, conventional delta-sigma modulators utilize complex clocking schemes that provide separate clock pulses for different events within the quantizer and the feedback circuitry. In these systems, separate clock pulses are generated for different events that occur within the quantizer and the digital feedback circuitry. Succeeding clock pulses with small delays between them may be used to control succeeding events. Separate clock lines are required for each succeeding clock signal and these signals must be synchronized properly. The additional parasitics and the added complexity of accurately synchronizing numerous clock signals with small delays between them can increase the power, area, and the overall design complexity. These drawbacks can become particularly limiting for high clock rates.

What is needed are methods and systems for improved feedback processing in delta-sigma modulators, including single bit and multi-bit delta-sigma modulators, continuous-time and discrete-time delta-sigma modulators, and digital and/or analog feedback loops.

BRIEF SUMMARY OF THE INVENTION

The invention relates to data converters and, more particularly, to analog-to-digital data converters, multi-bit analog delta-sigma modulators, and feedback processing. The invention provides methods and systems for improved feedback processing in delta-sigma modulators, including single bit and multi-bit delta-sigma modulators, continuous-time and discrete-time delta-sigma modulators, and digital and/or analog feedback loops.

In accordance with the invention, one or more processes are performed in a pipeline having a higher throughput rate than a throughput rate of a delta-sigma modulator. Any of a variety of processes and combinations of processes can be performed in the pipeline including, without limitation, quantization, digital signal processing, and/or feedback digital-to-analog conversion.

Further features and advantages of the invention, as well as the structure and operation of various embodiments of the invention, are described in detail below with reference to the accompanying drawings. The drawing in which an element first appears is typically indicated by the leftmost digit(s) in the corresponding reference number.

It is noted that the invention is not limited to the specific embodiments described herein. Such embodiments are presented herein for illustrative purposes only. Additional embodiments will be apparent to persons skilled in the relevant art(s) based on the teachings contained herein.

BRIEF DESCRIPTION OF THE DRAWINGS/FIGURES

The present invention will be described with reference to the accompanying drawings wherein:

FIG. 8 is a block diagram of an example second-order analog multi-bit delta-sigma modulator, in accordance with an aspect of the invention;

FIG. 13 is a process flowchart for performing feedback processing in discrete-time analog delta-sigma modulators, wherein analog-to-digital conversion and optional digital signal processing are performed at a higher throughput rate, in accordance with an aspect of the invention;

FIG. 14 is a process flowchart for performing feedback processing in continuous-time analog delta-sigma modulators, wherein analog-to-digital conversion is implemented at a lower throughput rate and digital signal processing is performed at a higher throughput rate, in accordance with an aspect of the invention;

FIG. 15 is a process flowchart for performing feedback processing in discrete-time analog delta-sigma modulators, wherein analog-to-digital conversion and optional digital signal processing are performed at a higher throughput rate, in accordance with an aspect of the invention;

FIG. 17 illustrates an exemplary logic implementation for a digital dither circuit that can be implemented within digital feedback circuitry, in accordance with an aspect of the present invention;

FIG. 18 illustrates an exemplary logic implementation for a dynamic element mismatch circuit that can be implemented within digital feedback circuitry, in accordance with an aspect of the present invention.

DETAILED DESCRIPTION OF THE INVENTION

Table of Contents
I. Introduction
II. Pipeline Processing
III. Example Delta-Sigma Modulators with Feedback Processing
IV. Example Digital Signal Processes
V. Example Methods for Feedback Processing
VI. Conclusions I. Introduction The invention relates to data converters and, more particularly, to analog-to-digital data converters, multi-bit analog delta-sigma modulators, and feedback processing. The invention provides methods and systems for improved feedback processing in delta-sigma modulators, including single bit and multi-bit delta-sigma modulators, continuous-time and discrete-time delta-sigma modulators, and digital and/or analog feedback loops.

Figure 1:
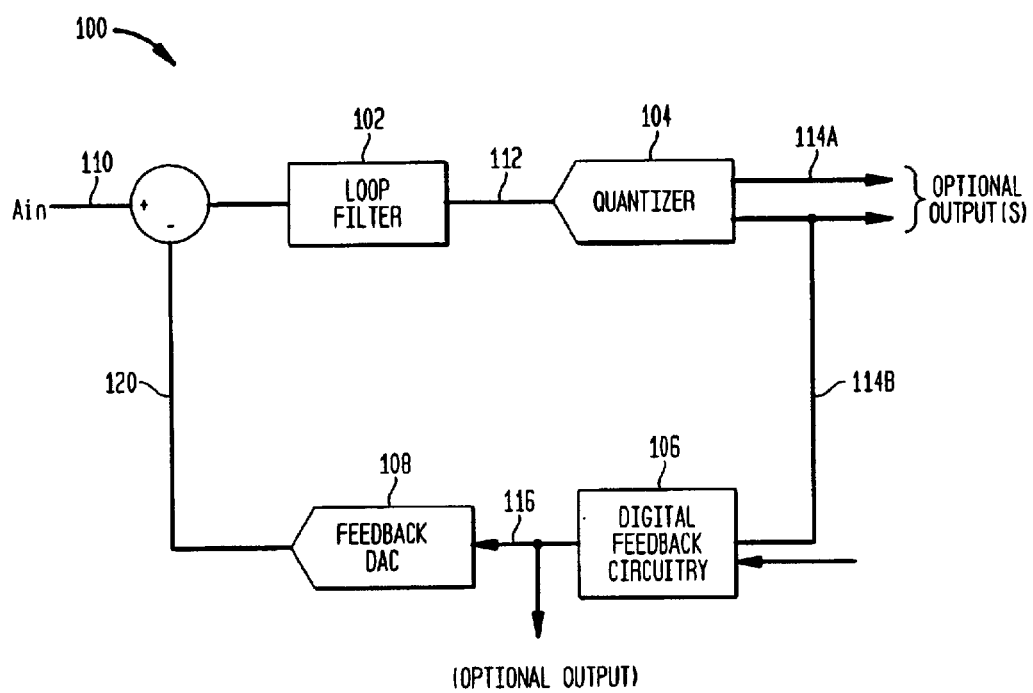
FIG. 1 is a high-level block diagram of an example delta-sigma modulator, in accordance with an aspect of the invention.

FIG. 1 is a high-level block diagram of an example delta-sigma modulator 100. The delta-sigma modulator 100 includes a loop filter 102, a quantizer 104, digital feedback circuitry 106, and a feedback digital-to-analog converter ("DAC") 108. The example delta-sigma modulator 100 optionally includes any of a variety of additional modules and/or loops, as is well known in the relevant art(s).

In operation, the delta-sigma modulator 100 receives an analog signal 110, which can be a continuous-time or discrete-time analog signal. The analog signal 110 is processed in the loop filter 102, as is well known in the relevant art(s). The loop filter 102 outputs one or more processed analog signals 112, which can be continuous-time or discrete-time analog signals. The quantizer 104 digitizes the processed analog signal 112, as is well known in the relevant art(s). The quantizer 104 outputs one or more discrete-time signals 114 that are representative of the processed analog signal 112. In an embodiment, one or more of the discrete-time signals 114 output from the quantizer 104 are provided as output signals of the delta-sigma modulator 100.

One or more of the discrete-time signals 114 generated by the quantizer 104 are provided to the digital feedback circuitry 106, which optionally performs one or more discrete-time processes on the signals. Alternatively, the digital feedback circuitry 106 simply passes the one or more of the discrete-time signals 114 with little, if any, processing The digital feedback circuitry provides one or more discrete-time feedback signals 116 to the feedback DAC 108, which converts the signals to one or more analog feedback signals 120.

The one or more analog feedback signals 120 are provided to a path of the delta-sigma modulator 100. For example, the loop filter 102, and optionally the quantizer 104, are referred to herein as a path of the delta-sigma modulator 100. The discrete-time signal 114b, the digital feedback circuitry 106, the discrete-time feedback signals 116, and the feedback DAC 108 are referred to herein as a feedback path. In the example of FIG. 1, the one or more analog feedback signals 120 subtracted from the input to the path formed by the the loop filter 102. The invention is not, however, limited to this example embodiment. In other embodiments, the one or more analog feedback signals 120 are provided to one or more other paths of the delta-sigma modulator 100, in addition to, or instead of providing the one or more analog feedback signals 120 as illustrated in FIG. 1.

In conventional delta-sigma modulators, delay in the quantizer 104, digital feedback circuitry 106, and/or feedback DAC 108, limit the number of processes that can be performed in these components. In accordance with the present invention, one or more of the quantizer 104, digital feedback circuitry 106, and/or feedback DAC 108 are optimized for improved performance. More specifically, the present invention increases the throughput (e.g., clock rate) of one or more of the quantizer 104, digital feedback circuitry 106, and/or feedback DAC 108 , relative to the throughput of the main path(s) of the delta-sigma modulator 100. By operating one or more of these circuits at higher throughputs, the throughput delay through them is reduced. Consequently a larger number of clock periods of delay is possible without degrading performance of the modulator. In this manner multiple events may be pipelined in the quantizer 104, digital feedback circuitry 106, and/or feedback DAC 108, without degrading modulator performance.

The present invention provides a means of dividing the time available for the quantizer and digital feedback circuit into smaller sections to make possible the use of pipelining in these circuits. This is possible with the present invention without requiring complex clock circuitry. In other words, the present invention does not require a large number of timing signals with complex synchronization of these timing signals. The present invention is particularly useful in deep submicron CMOS processes with digital logic speed that is typically very fast relative to the sample rate of the multi-bit analog delta-sigma modulator.

The events in the quantizer 104, digital feedback circuitry 106, and/or feedback DAC 108, preferably use synchronized operation in which pipelining is advantageous. For example a state machine may be used in the digital feedback circuit which uses synchronized operation of the changes of state.

The example delta-sigma modulator illustrated in FIG. 1 is provided for illustrative purposes. Based on the description herein, one skilled in the relevant art(s) will understand that the invention can be implemented in other delta-sigma modulator designs as well.

II. Pipeline Processing

In accordance with the invention, one or more processes are performed in a pipeline having a higher throughput rate than a throughput rate of the delta-sigma modulator. Any of a variety of processes and combinations of processes can be performed in the pipeline including, without limitation, quantization, digital signal processing, and/or feedback digital-to-analog conversion. The pipeline permits efficient implementation of hardware in analog delta-sigma modulators used for analog-to-digital conversion. The term efficiency, in this context, refers to reduction of circuit complexity and/or reduction of die area in integrated circuits.

The efficiency improvements provided with this invention are achieved through a pipelined implementation of the circuitry in the quantizer, the digital feedback circuitry, and/or the feedback digital to analog converter circuitry. These efficiency improvements are possible by operating the pipelined circuitry in the quantizer, digital feedback circuitry, and/or digital-to-analog converter circuitry at a throughput rate that is faster than the throughput rate of the delta-sigma modulator (e.g., faster than the sample rate of an analog delta-sigma modulator ADC).

A larger number of clock periods of throughput delay typically results in a simplification of circuitry, both in the multi-bit quantizer and in the digital feedback circuitry. Events may be pipelined within the quantizer and digital feedback circutry such that a number of events can occur one after another. Without high throughput pipelining in accordance with the present invention, however, increasing the number of events would result in greater overall delay and a corresponding degradation of loop stability and noise shaping performance.

To avoid performance degradation due to delay in the quantizer and digital feedback circuit in a multi-bit analog delta-sigma modulator the delay in these circuits must be made less than or equal to the number of clock periods required for optimum operation of the modulator. This typically precludes the use of pipelining techniques either in the quantizer or in the digital feedback circuit to aide in the implementation of these circuits. Pipelining techniques may be useful in the quantizer comparators. Multiple stages of pipelined comparator latches may be used to help reduce dynamic offsets and to improve comparator metastability. Pipelining techniques may also be used in the quantizer architecture to obtain a more efficient implementation of a high-resolution quantizer. For example, if the number of thresholds in the quantizer is large (i.e., high resolution) then the pipelined ADC architecture is much more efficient than a Flash ADC architecture. That is, the pipelined ADC architecture requires fewer comparators and it also less sensitive to comparator offsets. Pipelining may also be used in the digital feedback circuit to allow a state-machine implementation with more than one state entered for each piece of data processed in the feedback circuit. In order to make use of extensive pipelining the modulator sample clock period must be divided into finer resolution in time.

Pipelined circuitry, in accordance with the present invention, utilizes division of an overall processing task into many processing sub-tasks. Each sub-task within a pipelined circuit is performed on a sample of data while the previous sub-task is performed on the next sample of data, and while the next sub-task is performed on the previous sample of data. Pipelined circuitry can operate at a maximum rate of speed determined by the length of time of the lengthiest sub-task within the pipeline. The total length of time required to complete the processing of a single sample is equal to the total number of sub-tasks divided by the rate of speed used to operate the pipeline.

A pipelined circuit operated at a higher throughput rate than that of the main path of the delta-sigma modulator, can complete the entire processing task in a shorter amount of time than if the pipelined circuit operated at the speed of the main path of the delta-sigma modulator. There is an inverse relationship between the length of time required to complete the entire processing task and the total number of sub-tasks in the pipeline. Preferably, the number of pipelined sub-tasks are optimized to obtain more efficient circuit implementation. In a complex circuit this may require a large total number sub-tasks.

For example, many sub-tasks may be desirable for efficient implementation of a multi-bit analog delta-sigma modulator which uses a large number of bits in the quantizer, and/or uses a complex digital feedback circuit, and/or uses a large number of bits in the feedback DAC circuitry. A large number of sub-tasks, which may be very useful for efficient circuit implementation of the pipelined circuits, will typically result in longer total length of time to complete the overall processing tasks.

For example, in a discrete-time analog delta-sigma modulator ADC, there is typically a fixed amount of time available to complete the processing required by the quantizer, digital feedback circuitry, and feedback digital to analog converter circuitry. This fixed amount of time is typically inversely proportional to the sample rate of the analog delta-sigma modulator ADC. If a large number of pipelined sub-tasks are used for efficient implementation of these circuits then, the rate of speed of these circuits should increase in proportion to the total number of sub-tasks. The rate of speed of the pipelined circuits should be greater than the sample rate of the analog delta-sigma modulator ADC.

In order to operate the pipelined circuitry at a higher throughput rate than the rate used by the other circuitry in the delta-sigma modulator, the high-rate pipelined circuitry preferably over-samples the low-rate signal at its input. Thus, the pipelined circuitry may process multiple identical, or nearly identical samples of the signal at its input. For example, if the pipelined circuitry operates at a rate that is 4 times faster than the main path of the delta-sigma modulator, then it should sample 4 identical, or nearly identical samples of the signal at its input for each single sample processed in the main path of the delta-sigma modulator.

Similarly, the lower throughput rate circuitry at the output of the high throughput rate pipelined circuitry should sub-sample the high-rate signal. That is, the lower throughput rate circuitry in the delta-sigma modulator that interfaces to the output of the higher throughput rate pipelined circuitry should decimate the higher rate signal. For example, if the pipelined circuitry operates a rate that is 4 times faster than the main path of the delta-sigma modulator, then the lower throughput rate circuitry following the high-rate pipelined circuitry should discard 3 out of every 4 samples provided by the high-rate pipelined circuitry.

In accordance with the invention, the quantizer, the digital feedback circuitry and/or the feedback digital to analog circuitry may be implemented with high-rate pipelined circuits. High throughput rate pipelined circuit implementation options for discrete-time analog delta-sigma modulators include, without limitation:

quantizer alone;

quantizer and digital feedback circuitry;

quantizer and digital feedback circuitry and feedback digital-to-analog converter circuitry;

digital feedback circuitry alone;

digital feedback circuitry and feedback digital-to-analog converter circuitry;

quantizer and a portion of the digital feedback circuitry;

a portion of the digital feedback circuitry alone; and a portion of the digital feedback circuitry and feedback digital-to-analog converter circuitry.

The first high throughput rate circuit implemented in the pipeline should over-sample the lower rate signal provided from the preceding lower throughput rate circuitry. Similarly, the lower throughput rate circuitry that follows the last higher throughput rate circuit in the pipeline should sub-sample the output of the last higher throughput rate circuit.

The invention is useful in single-bit delta-sigma modulators and multi-bit delta-sigma modulators. Single-bit analog delta-sigma modulators are typically implemented with simple quantizers and with simple feedback digital to analog converter circuitry. Digital feedback circuitry thus may not always be advantageous in single-bit analog delta-sigma modulators or, if used, may be very simple and therefore may be inherently efficient to implement (e.g. delay elements).

Multi-bit delta-sigma modulators, on the other hand, typically require more complex circuit implementations for the quantizer, the digital feedback circuitry, and the feedback DAC circuitry, as compared to single bit delta-sigma modulators. For example, in multi-bit systems, digital feedback circuitry (e.g. dynamic element mismatch circuitry) is typically required to achieve high linearity and high performance analog-to-digital conversion. The invention is thus especially useful in multi-bit delta-sigma modulators.

The preceding discussion focuses primarily on discrete-time analog delta-sigma modulator implementations. There are some differences in operation between discrete-time and continuous-time modulator implementations.

For example, a peculiarity of continuous-time modulators is that there is not a fixed amount of time to implement the processing provided by the quantizer, the digital feedback circuitry, and/or the feedback DAC circuitry. In a continuous-time modulator the performance of the modulator typically degrades if the amount of time for the processing (i.e., delay) of these blocks is increased. Delay can degrade stability of the continuous-time modulator loop and can degrade noise-shaping performance. In a continuous-time modulator it is desirable to make the amount of time required for the processing of these blocks very small with respect to the time constants of the continuous time filter circuitry within the analog continuous-time modulator loop.

In the discrete time modulator, on the other hand, there is typically a fixed amount of time available. In the discrete time modulator, if the processing takes more time than the fixed amount of delay, the modulator generally will not operate properly. If the processing takes less time than the fixed amount of delay, then additional delay may be added to increase the processing time to equal the fixed amount of time available.

III. Example Delta-Sigma Modulators with Feedback Processing

Figure 2:
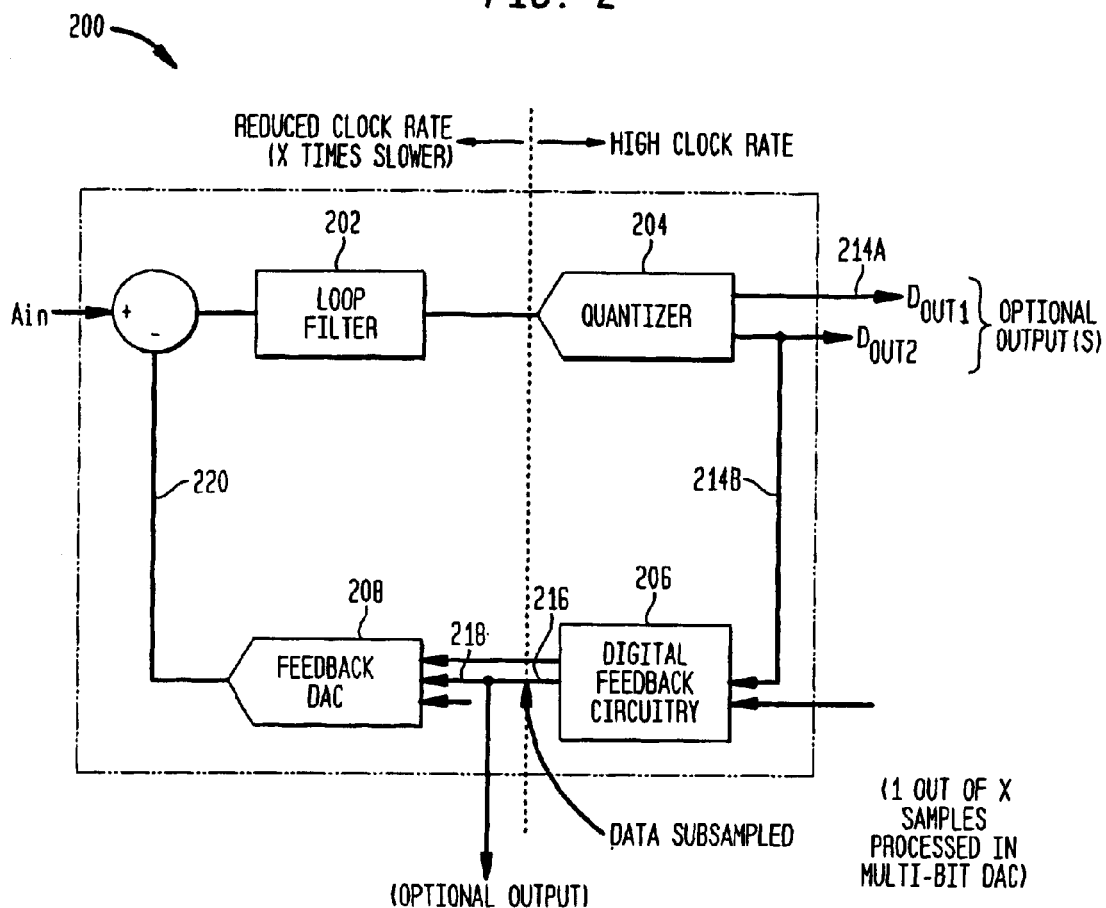
FIG. 2 is a block diagram of a multi-bit delta-sigma modulator, including multi-bit quantizer circuitry, digital feedback circuitry, and feedback DAC circuitry, in accordance with an aspect of the invention.

FIG. 2 illustrates a multi-bit delta-sigma modulator 200, including multi-bit quantizer circuitry 204, digital feedback circuitry 206, and feedback DAC circuitry 208. In this example, the multi-bit quantizer circuitry 204 and the digital feedback circuitry 206 operate at a higher rate and the feedback DAC circuitry operates at a reduced rate. The main path of the multi-bit analog delta-sigma modulator 200 also operates at the reduced clock rate. This reduced clock rate is X times s lower than the high clock rate of the multi-bit quantizer circuitry 204 and the digital feedback circuitry 206.

One or more higher data rate discrete-time output signals 214b are provided from the multi-bit quantizer circuitry 204 to at least one input of the digital feedback circuitry 206. The one or more higher data rate discrete-time output signals 214b output from the multi-bit quantizer are sampled by the digital feedback circuitry 206 and processed at the high clock rate.

At least one digital output signal 216 of the digital feedback circuitry 206 is sub-sampled at the reduced rate to provide at least one digital input signal 218 for the feedback DAC circuitry 208. In other words, one out of every X samples that are processed by the multi-bit quantizer circuitry 204 and the digital feedback circuitry 206 are converted back to an analog feedback signal 220 to be used as feedback in the multi-bit analog delta-sigma modulator 200.

The total throughput delay time of the multi-bit quantizer circuitry 204 and the digital feedback circuitry 206 is substantially equal to the product of the number of clock periods of delay in these circuits and the period of the clock used in these circuits. Since these circuits are operated at the higher clock rate, the clock period is reduced by a factor of X. The total throughput delay of the multi-bit quantizer and digital feedback circuit therefore decreases in proportion to X. In an embodiment at least one digital output signal of the digital feedback circuitry 206 is subsampled at the reduced rate to provide at least one digital output signal of analog delta-sigma modulator 200.

Figure 3:
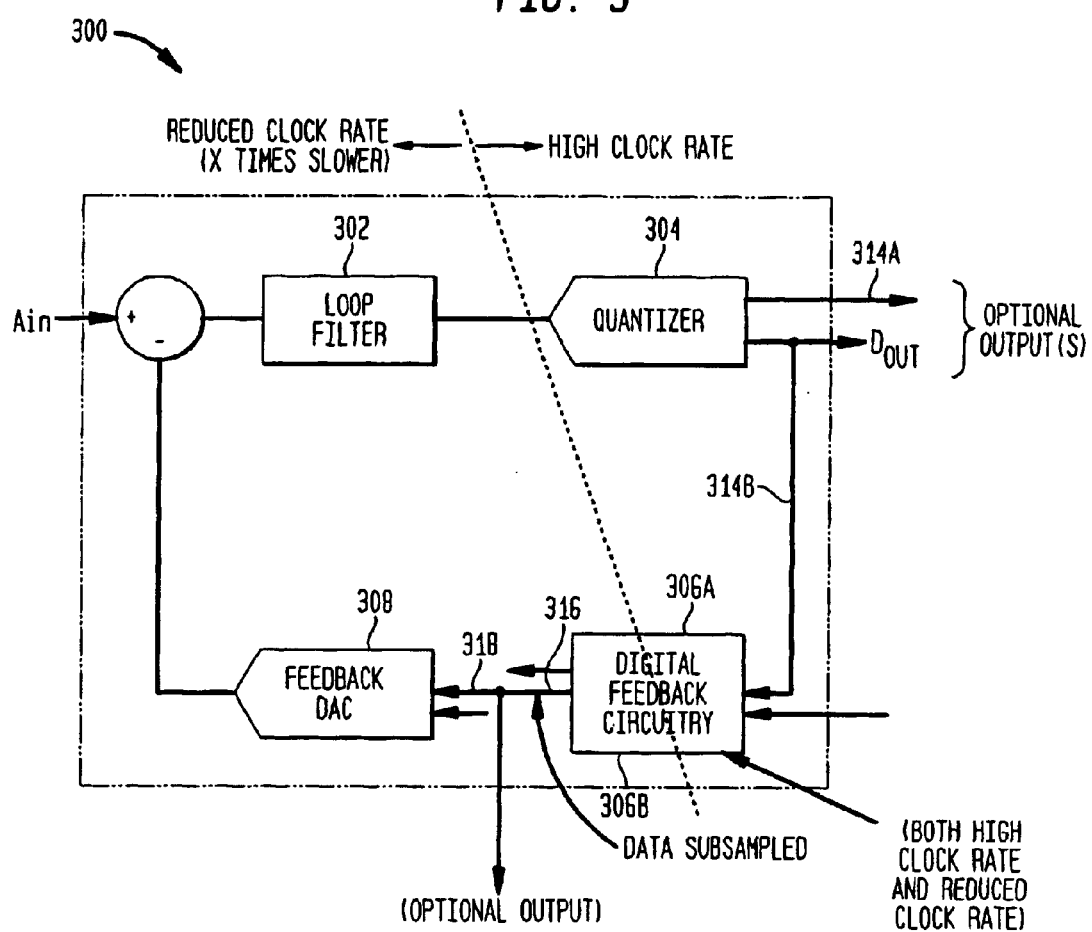
FIG. 3 is a block diagram of another multi-bit delta-sigma modulator in accordance with an aspect of the invention.

FIG. 3 illustrates a multi-bit delta-sigma modulator 300, including multi-bit quantizer circuitry 304, digital feedback circuitry 306, and feedback DAC circuitry 308. In this example, the multi-bit quantizer circuitry 304 and a portion 306a of the digital feedback circuitry 306 operate at a higher rate. The feedback DAC circuitry 308 and a remainder portion 306b of the digital feedback circuitry 306 operate at a reduced rate. The main path of the multi-bit analog delta-sigma modulator 300 also operates at the reduced clock rate. This reduced clock rate is X times s lower than the high clock rate of the multi-bit quantizer circuitry 204 and the digital feedback circuitry 206.

In operation, a digital output signal 314a of the multi-bit quantizer circuitry 304 is passed at the high rate to at least one input of the digital feedback circuitry 306. The digital feedback circuitry 306 processes the data from the multi-bit quantizer using a combination of digital circuitry operating at the high-rate and digital circuitry operating at the reduced rate. At least one digital output signal 316 of the digital feedback circuitry 306 is sub-sampled at the reduced rate to provide at least one digital input signal 318 for the feedback DAC circuitry 308. In an embodiment at least one digital output signal of the digital feedback circuitry 306 is sub-sampled to provide at least one digital output signal of multi-bit analog delta-sigma modulator 300.

Figure 4:
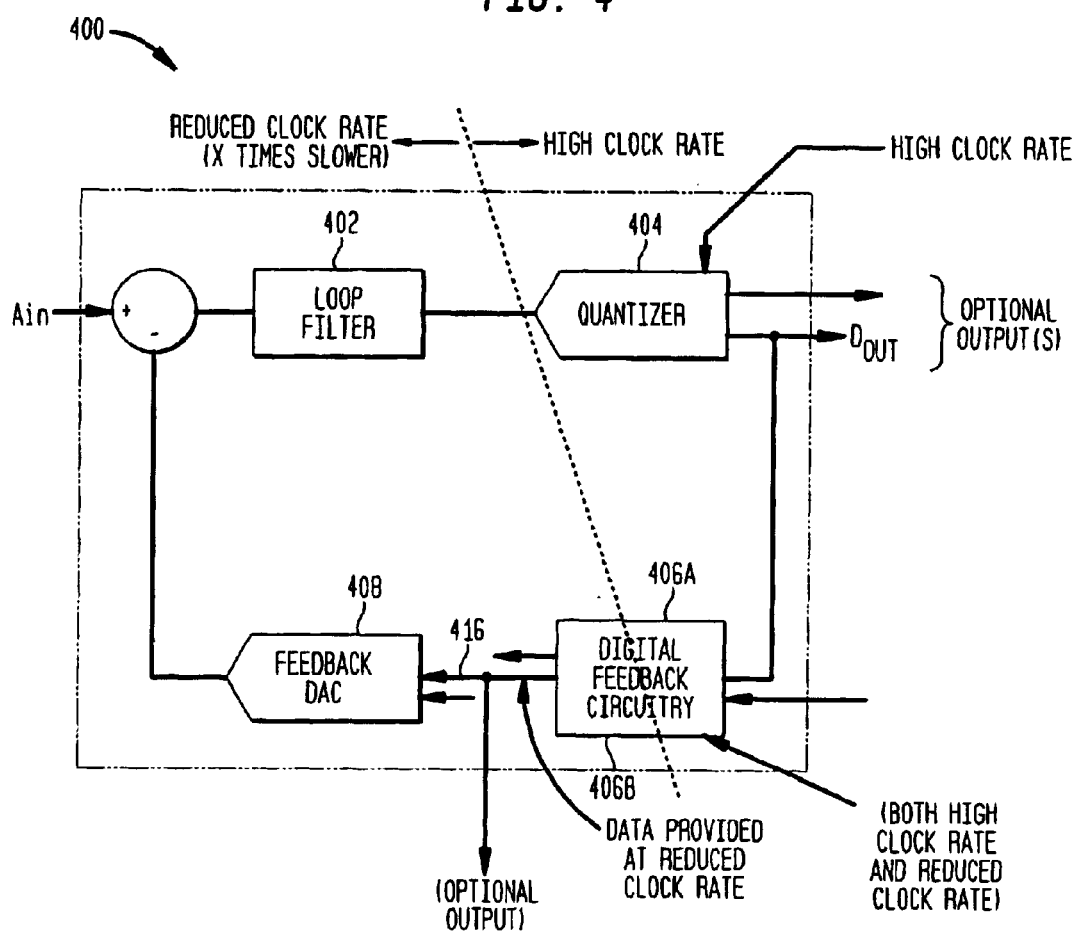
FIG. 4 is a block diagram of another multi-bit delta-sigma modulator in accordance with an aspect of the invention.

FIG. 4 illustrates a multi-bit delta-sigma modulator 400, including multi-bit quantizer circuitry 404, digital feedback circuitry 406, and feedback DAC circuitry 408. The multi-bit delta-sigma modulator 400 is substantially similar to the multi-bit delta-sigma modulator 300, except that here, at least one digital ouput signal 416 of the digital feedback circuitry 406 is provided at the reduced rate to at least one input of the feedback DAC circuitry 408. In an embodiment at least one digital output signal of the digital feedback circuitry 406 provides at least one digital output signal of multi-bit analog delta-sigma modulator 400.

Figure 5:
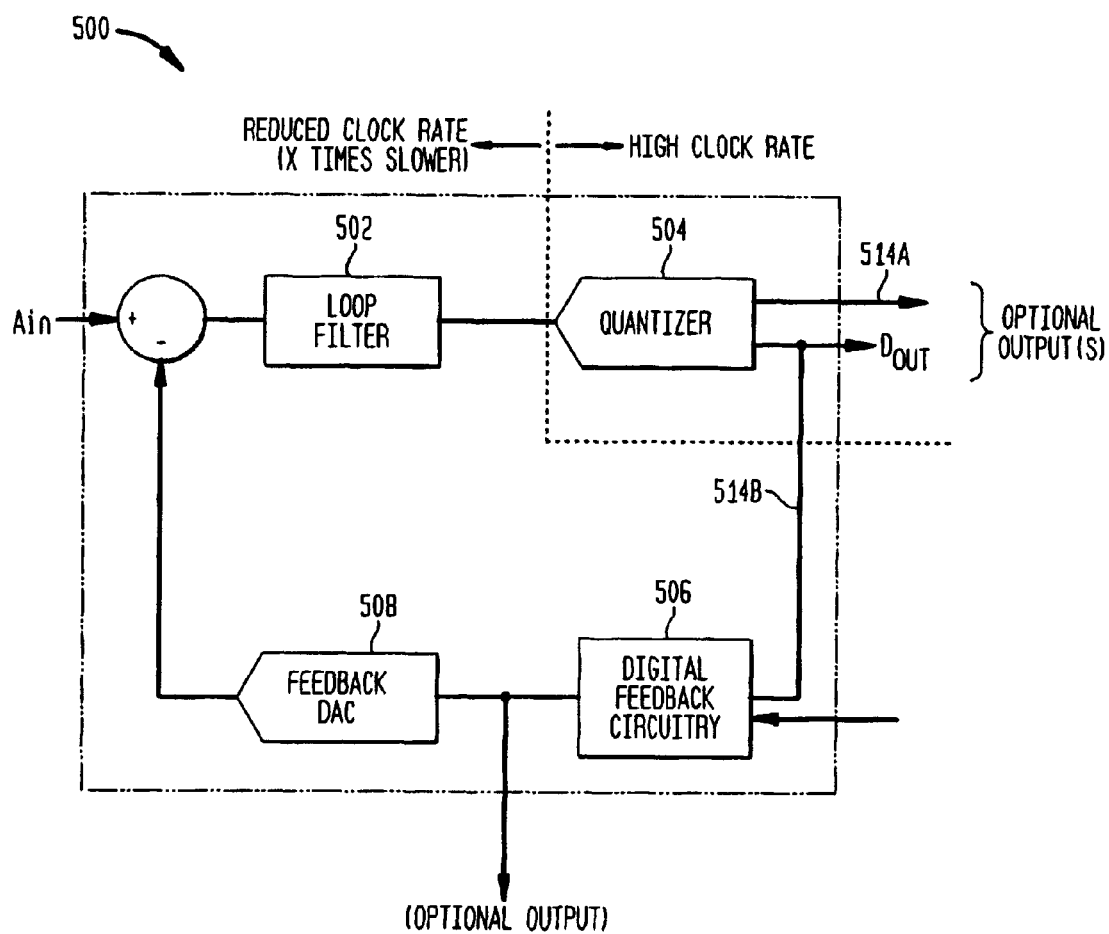
FIG. 5 is a block diagram of another multi-bit delta-sigma modulator in accordance with an aspect of the invention.

FIG. 5 illustrates a multi-bit delta-sigma modulator 500, including multi-bit quantizer circuitry 504, digital feedback circuitry 506, and feedback DAC circuitry 508. In this example, the multi-bit quantizer circuitry 504 operates at a higher rate and the digital feedback circuitry 506 and the feedback DAC 508 operate at a lower rate. A digital output signal 514b of the multi-bit quantizer circuitry 504 is sub-sampled at the reduced rate and provided to the digital feedback circuitry 506. In an embodiment at least one digital output signal of the digital feedback circuitry 506 provides at least one digital output signal of multi-bit analog delta-sigma modulator 500.

Figure 6:
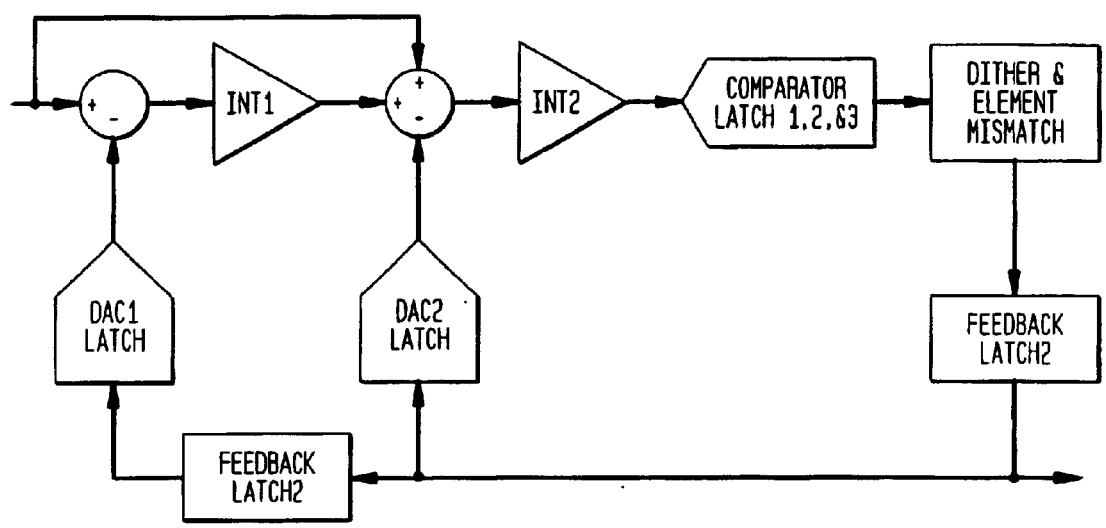
FIG. 6 is a block diagram of a second order analog multi-bit delta-sigma modulator, in accordance with an aspect of the invention.
Figure 7A:
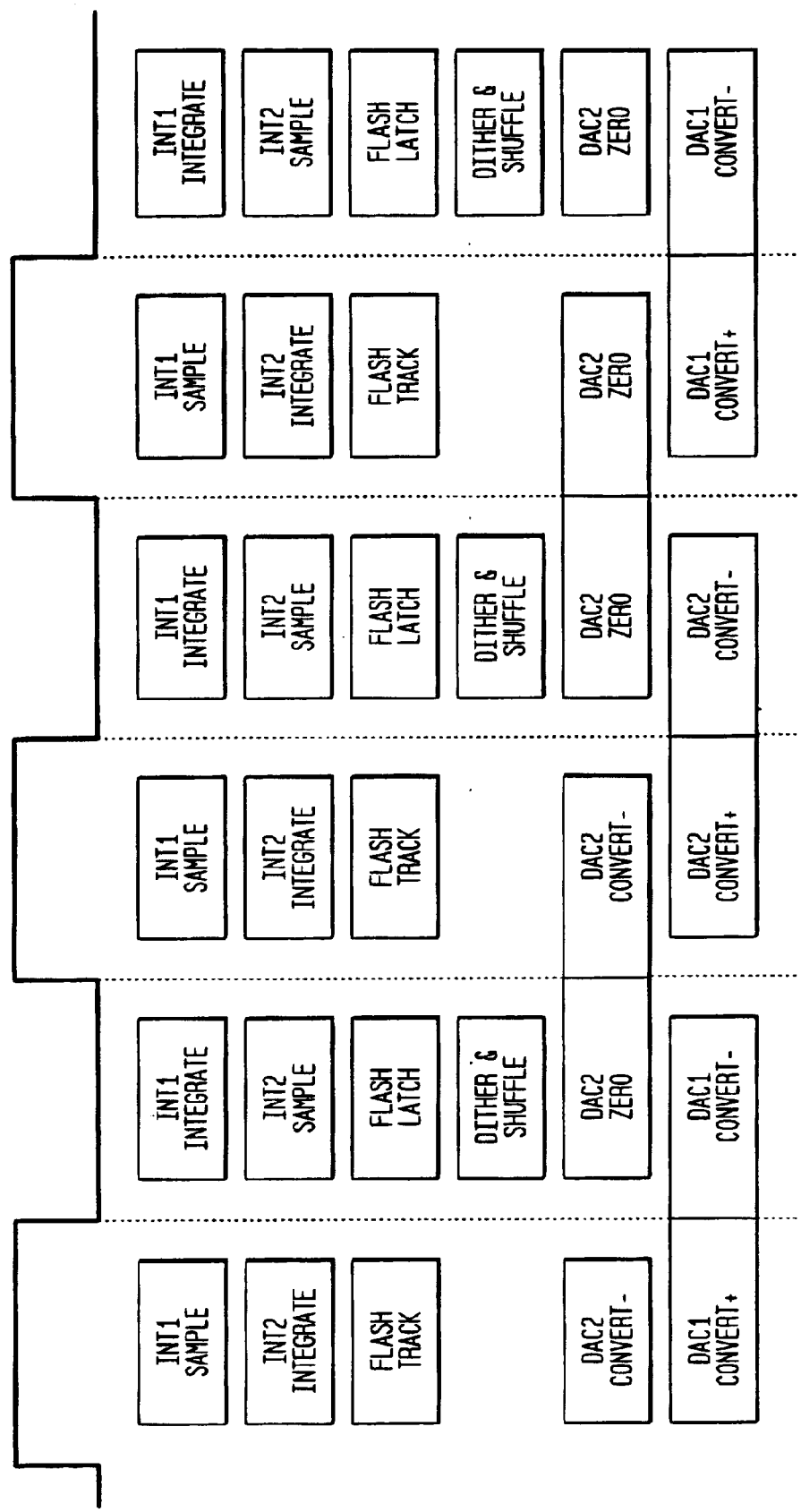
FIG. 7A illustrates an example timing diagram for the analog multi-bit delta-sigma modulator illustrated in FIG. 6.
Figure 7B:
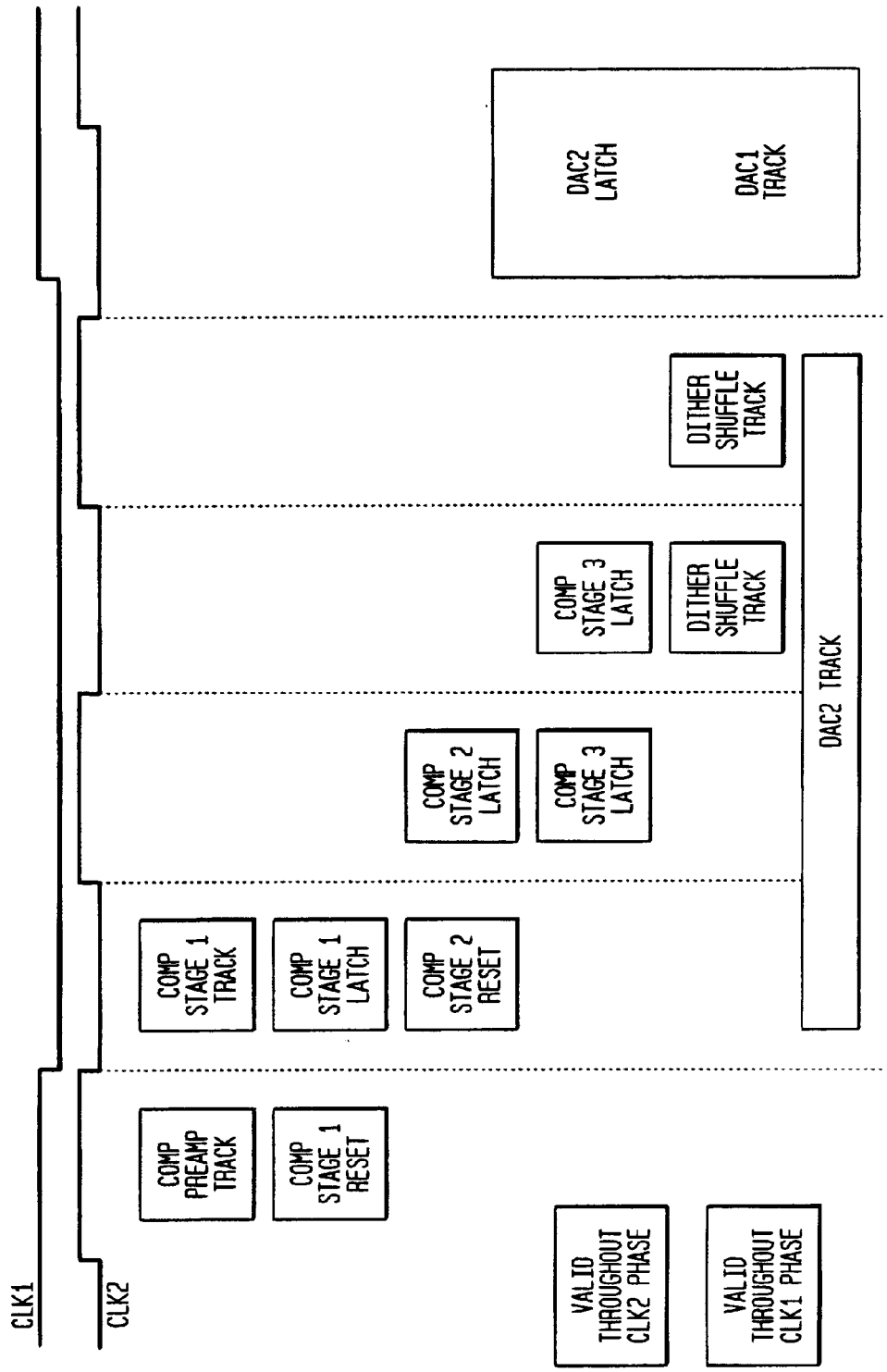
FIG. 7B illustrates an example timing diagram for an exemplary feedback processing circuit for the analog multi-bit delta-sigma modulator illustrated in FIG. 6.
Figure 7C:
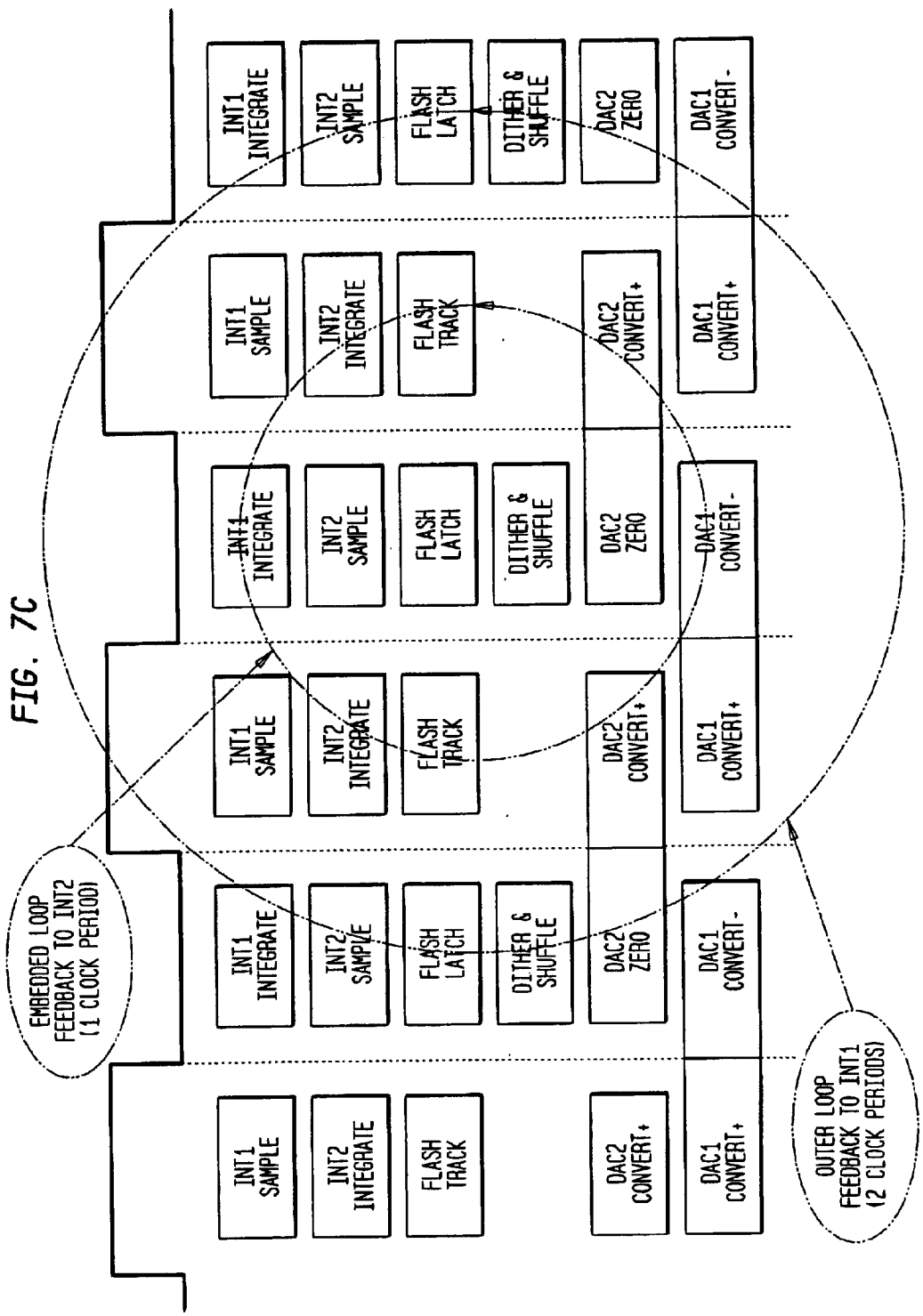
FIG. 7C illustrates another example timing diagram for the analog multi-bit delta-sigma modulator illustrated in FIG. 6.

FIG. 6 is a block diagram of an example second order analog multi-bit delta-sigma modulator 600, implemented in accordance with the present invention. FIGS. 7A, 7B, and 7C illustrate example timing diagrams for the analog multi-bit delta-sigma modulator 600.

In this implementation the analog multi-bit delta-sigma modulator circuitry is clocked at a lower rate (e.g., 24.576 MHz), and the quantizer and digital feedback circuitry are clocked at a higher rate (e.g., 98.304 MHz). This results in a factor of 4 between the higher clock rate (98.304 Mhz) of the quantizer and feedback circuitry and the lower clock rate (24.576 MHz) of the analog multi-bit delta-sigma modulator.

In an embodiment, the analog multi-bit delta-sigma modulator 600 is implemented to tolerate throughput delay through the quantizer and digital feedback circuitry of approximately one-half of a clock period of the lower rate clock. For example, one-half clock period of the 24.576 MHz clock corresponds to 20.345 ns of delay. This one-half clock period of the lower rate clock (e.g., 24.576 MHz), corresponds to 2 clock periods of the higher rate clock (e.g., 98.304 MHz), used in the quantizer and digital feedback circuitry.

In an embodiment, these circuits are timed using each edge of the higher rate clock. A total of 4 clock edges (2 rising edges and 2 falling edges) occur during 2 clock periods. Consequently 4 pipelined events can be timed in the quantizer and digital feedback circuitry (one event per clock edge). In an embodiment, the four events are divided evenly between the quantizer and the digital feedback circuitry. For example, in an embodiment, the quantizer circuitry includes a two-stage latch which use the first 2 clock phases. In an embodiment, the digital feedback circuitry includes two digital circuits, a digital dither circuit and a dynamic element mismatch circuit (referred to here as a "shuffler" circuit). The latter two processes are described below. Each of these circuits use the second two clock phases.

Figure 9:
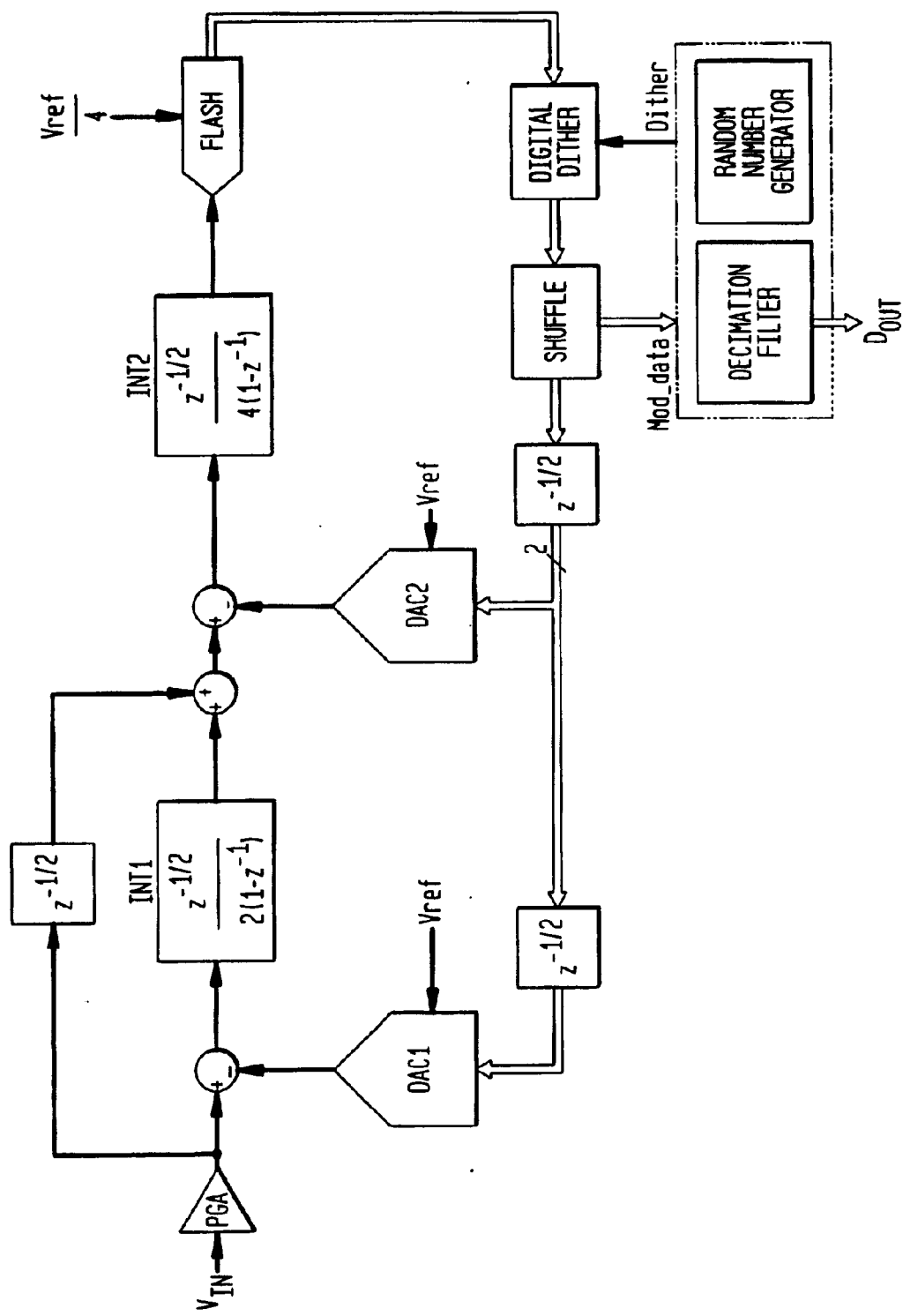
FIG. 9 is an example system diagram for the second-order analog multi-bit delta-sigma modulator illustrated in FIG. 8.
Figure 15A:
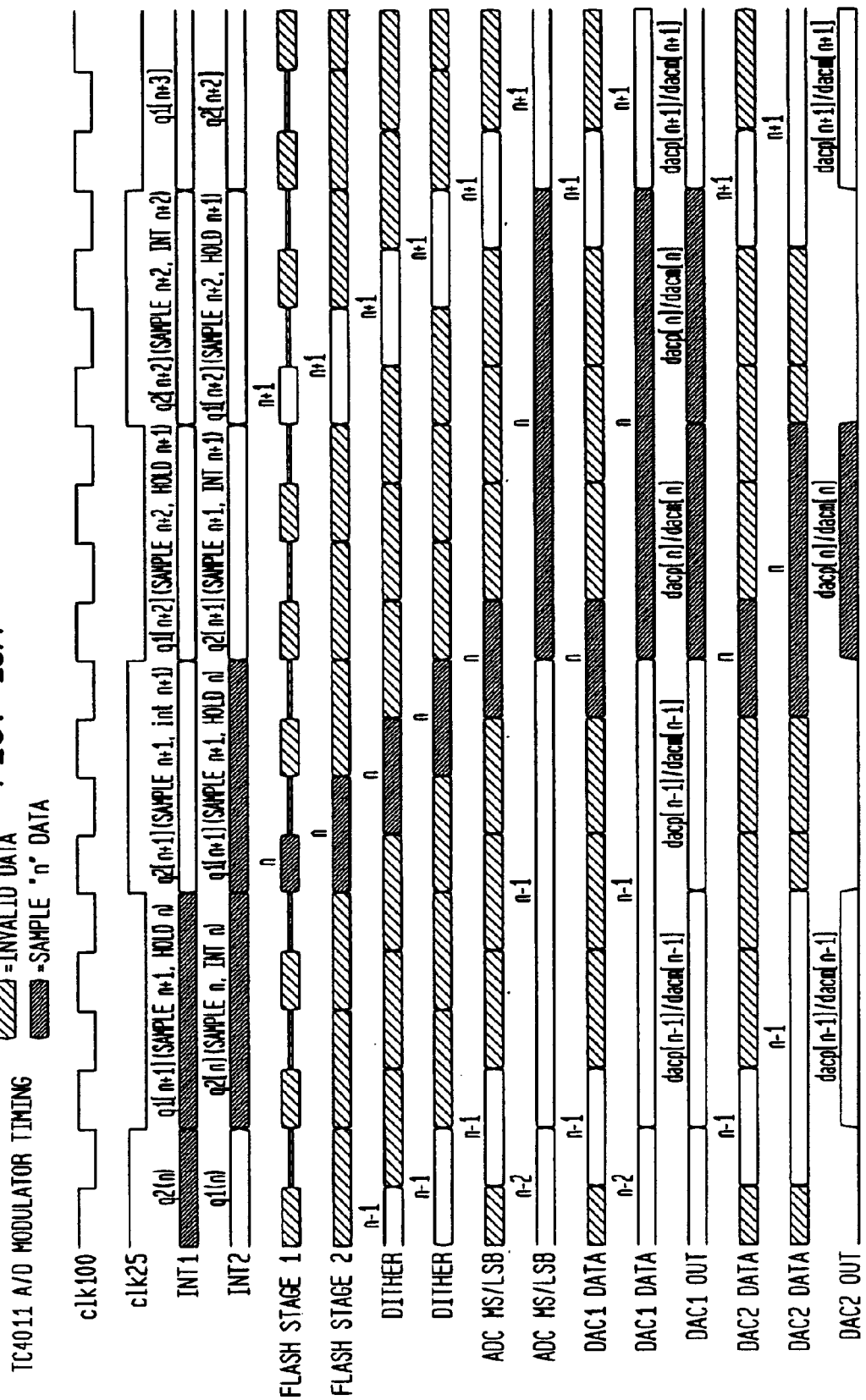
FIG. 15A illustrates an example timing diagram for the analog multi-bit delta-sigma modulator illustrated in FIG. 8.
Figure 15B:
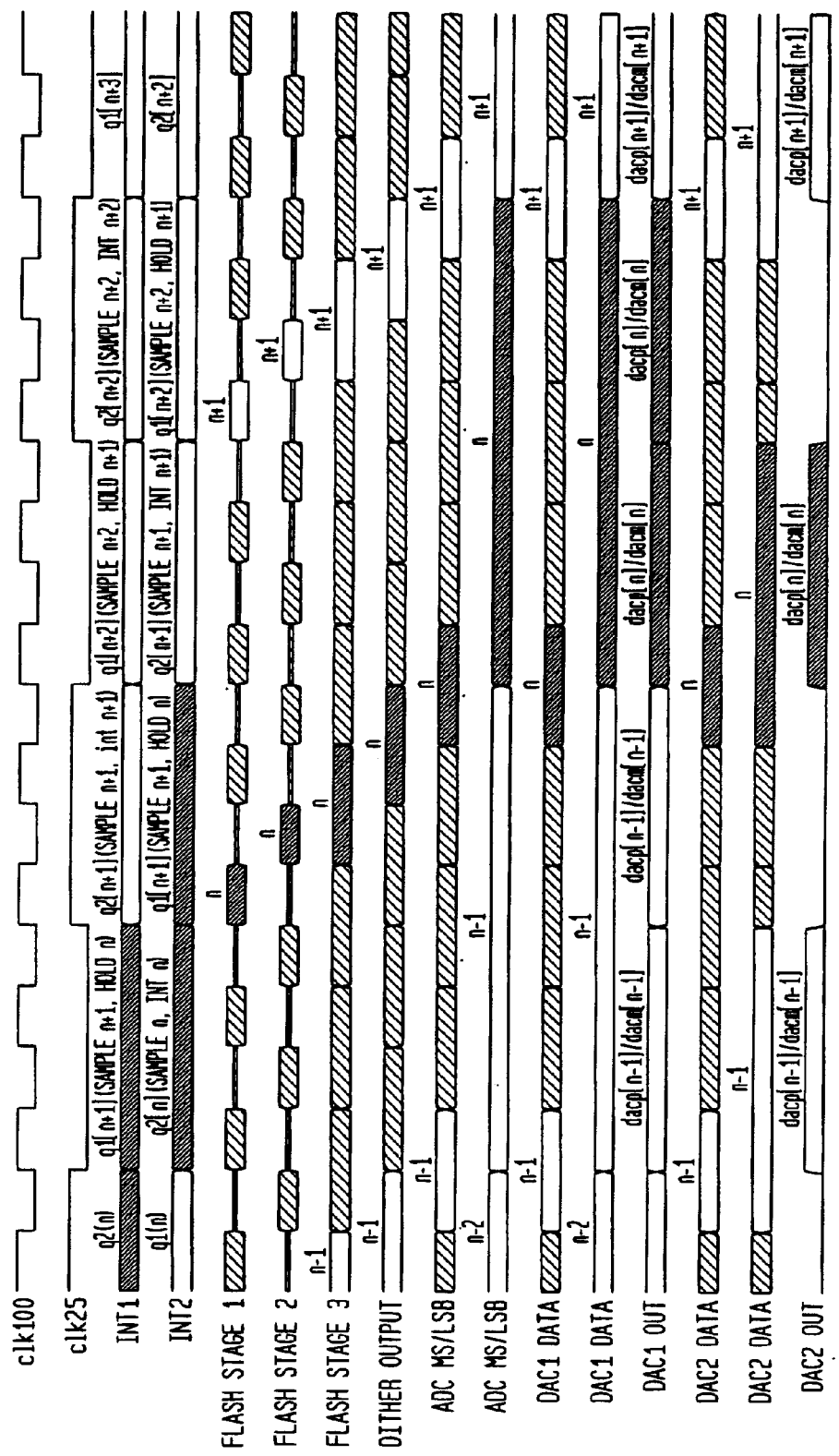
FIG. 15B illustrates another example timing diagram for the analog multi-bit delta-sigma modulator illustrated in FIG. 8.

FIG. 8 is a block diagram of another example analog multi-bit delta-sigma modulator 800, implemented in accordance with the present invention. FIG. 9 illustrates an example system diagram for the analog multi-bit delta-sigma modulator 800. FIGS. 15A and 15B illustrate example timing diagrams for the analog multi-bit delta-sigma modulator 800, using 0.13 μm processes and 0.18 μm processes, respectively.

Figure 12:
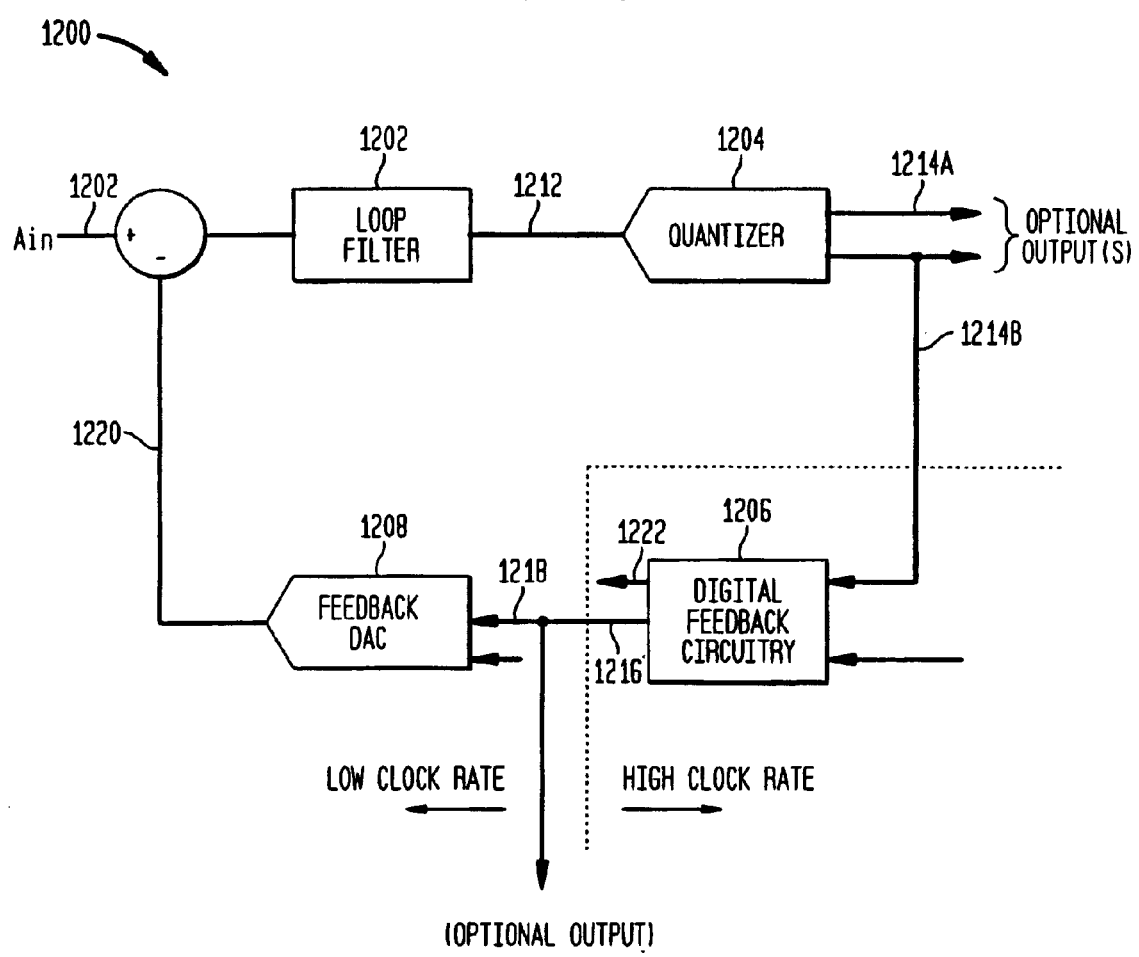
FIG. 12 is a block diagram of another multi-bit delta-sigma modulator, in accordance with an aspect of the invention.

FIG. 12 illustrates a multi-bit delta-sigma modulator 1200, including multi-bit quantizer circuitry 1204, digital feedback circuitry 1206, and feedback DAC circuitry 1208. In this example, the multi-bit quantizer circuitry 1204 and the feedback DAC 1208 operate at a lower rate. The digital feedback circuitry 1206 operates at a higher rate. A lower rate digital signal 1214b from the quantizer circuitry 1204 is oversampled for use in the higher rate digital feedback circuitry 1206. At least one digital output signal 1216 of the digital feedback circuitry 1206 is sub-sampled at the reduced rate to provide at least one lower rate digital input signal 1218 to the lower rate feedback DAC circuitry 1208. In an embodiment, at least one digital output signal of the digital feedback circuitry 1206 is subsampled to provide at least one digital output signal of multi-bit analog delta-sigma modulator 1200.

IV. Example Digital Signal Processes

One or more of a variety of digital signal processes can be performed in the digital feedback circuitry 106. For example, in an embodiment, digital dither is applied to the digital signal in the digital feedback circuitry 106 to break up limit cycles in a delta-sigma modulator and reduce large amplitude idle tones which commonly occur near one-half the sample rate of the delta-sigma modulator.

In an embodiment, an analog signal from a path of a delta-sigma modulator is quantized to an m-bit digital signal. An n-bit dithered digital feedback signal is generated from at least a portion of the m-bit digital signal. The n-bit dithered digital feedback signal is converted to an analog feedback signal and subtracted from the path of the delta-sigma modulator. In an embodiment, the n-bit dithered digital feedback signal is generated by selecting one of a plurality of sets of n-bits from the m-bit digital signal depending upon a state of a dither control signal. The dither control signal can alternate between a plurality of states or pseudo-randomly switch between a plurality of states. In an embodiment, the m-bit digital signal is an m-bit thermometer code signal and the n-bit dithered digital feedback signal is generated by selecting between bits 0 through m-2 and bits 1 through m-1 of the m-bit digital signal. In an alternative embodiment, the n-bit dithered digital feedback signal is generated by selecting between even and odd bits of the m-bit digital signal.

Methods and systems for adding digital dither are described in commonly owned U.S. Pat. No. 6,577,257, titled "Methods and Systems for Digital Dither," filed on Sep. 12, 2001, incorporated herein by reference in its entirety.

In an embodiment, the digital feedback circuitry 106 includes a dynamic element mismatch circuit and/or a shuffler circuit. Mismatch shaping circuitry and shuffler circuitry shape mismatches in the analog elements to substantially reduce errors in the signal band of an over sampling converter.

Additional methods and systems for dynamic mismatch shaping and shuffling are described in the following and commonly owned U.S. applications, all of which are incorporated herein by reference in their entireties:

Ser. No. 09/949,807, titled "Method and Apparatus for Mismatched Shaping of An Oversampled Converter," filed on Sep. 12, 2001; and Ser. No. 09/949,815, titled "Method and Apparatus for Mismatched Shaping of An Oversampled Converter," filed on Sep. 12, 2001.

Mismatch shaping is also taught in one or more of the following U.S. patents, all of which are incorporated herein by reference in their entireties:

U.S. Pat. No. 5,404,142 (Adams et al.), titled "Data-Directed Scrambler For Multi-Bit Noise Shaping D/A Converters";

U.S. Pat. No. 5,406,283 (Leung), titled "Multi-bit Oversampled DAC with Dynamic Element Matching"; and U.S. Pat. No. 5,684,482 (Galton), titled "Spectral Shaping of Circuit Errors In Digital-to-Analog Converters."

Digital processes performed within the digital feedback circuitry 106 are not limited digital dither, dynamic element mismatch, and shuffling. Based on the description herein, one skilled in the relevant art(s) will understand that other digital processes can be performed in addition to, or as alternatives to digital dither, dynamic element mismatch, and shuffling. Such other digital processes are withing the scope of the present invention.

V. Example Methods for Feedback Processing

Aspects of the present invention are now described with reference to process flowcharts illustrated in FIGS. 11, 13, 14, and 15. The processes illustrated therein are described below with reference to one or more of the block diagrams illustrated in FIGS. 1, 2, 3, 4, 5, and 12. The process flowcharts illustrated herein are not, however, limited to the block diagrams referenced herein. Based on the description and drawings herein, one skilled in the relevant art(s) will understand that the process flowcharts can be implemented for other delta-sigma modulator embodiments as well.

Figure 10:
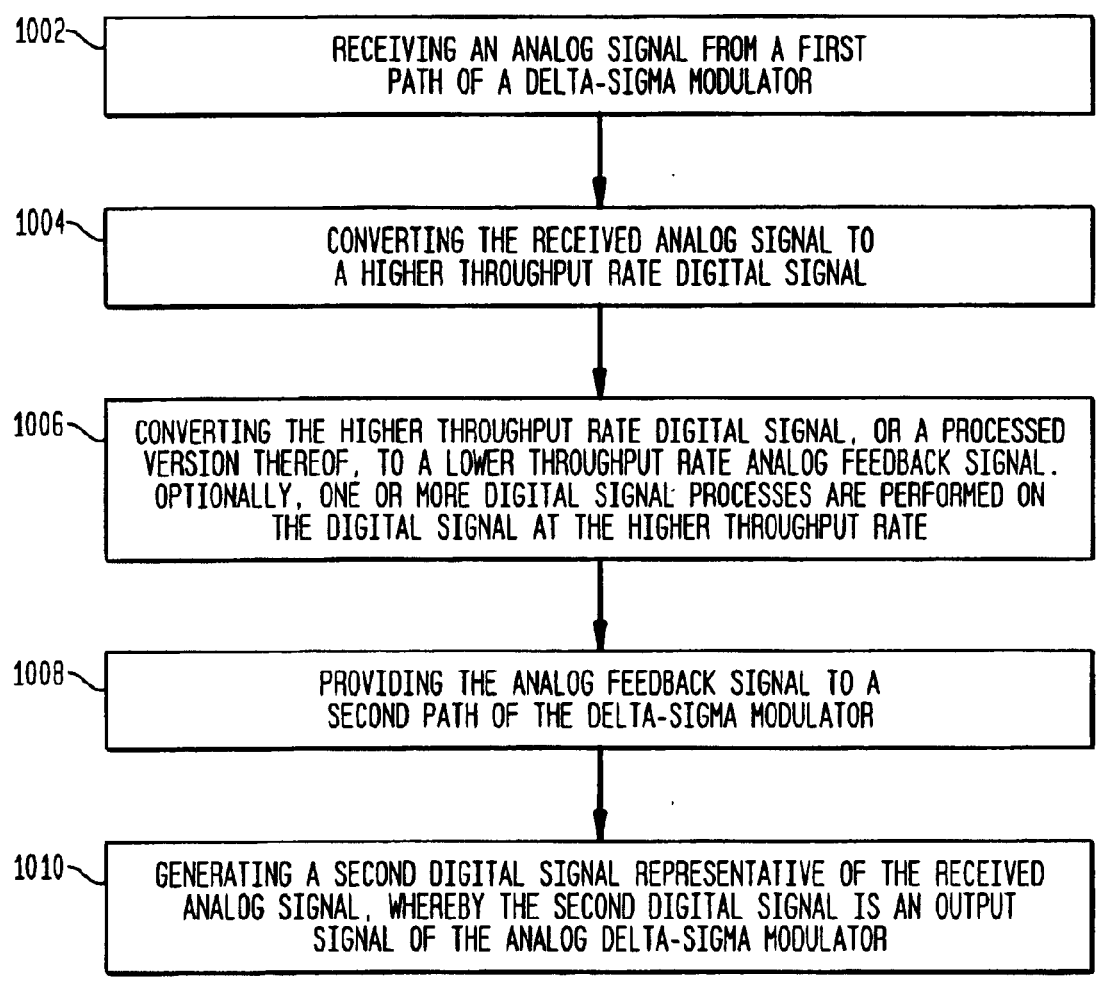
FIG. 10 illustrates a high-level process flowchart for performing feedback processing in analog delta-sigma modulators, in accordance with an aspect of the invention.

FIG. 10 illustrates a high-level process flowchart 1000 for performing feedback processing in analog delta-sigma modulators. The process illustrated in the high level process flowchart 1000 can be implemented for continuous-time and/or discrete-time analog delta-sigma modulators, single-bit and/or multi-bit delta-sigma modulators. The process flowchart 1000 is described below with reference to the high level block diagram of FIG. 100.

The process begins at step 1002, receiving an analog signal from a first path of a delta-sigma modulator. Step 1004 includes converting the received analog signal to a higher throughput rate digital signal. Step 1006 includes converting the higher throughput rate digital signal, or a processed version thereof, to a lower throughput rate analog feedback signal. Optionally, one or more digital signal processes are performed on the digital signal at the higher throughput rate. Step 1008 includes providing the analog feedback signal to a second path of the delta-sigma modulator. Step 1010 includes generating a second digital signal representative of the received analog signal, whereby the second digital signal is an output signal of the analog delta-sigma modulator. In accordance with the invention, one or more tasks performed by one or more of the quantizer circuitry 100, the digital feedback circuitry 106, and/or the feedback DAC 108, are performed at the higher throughput rate.

Figure 11:
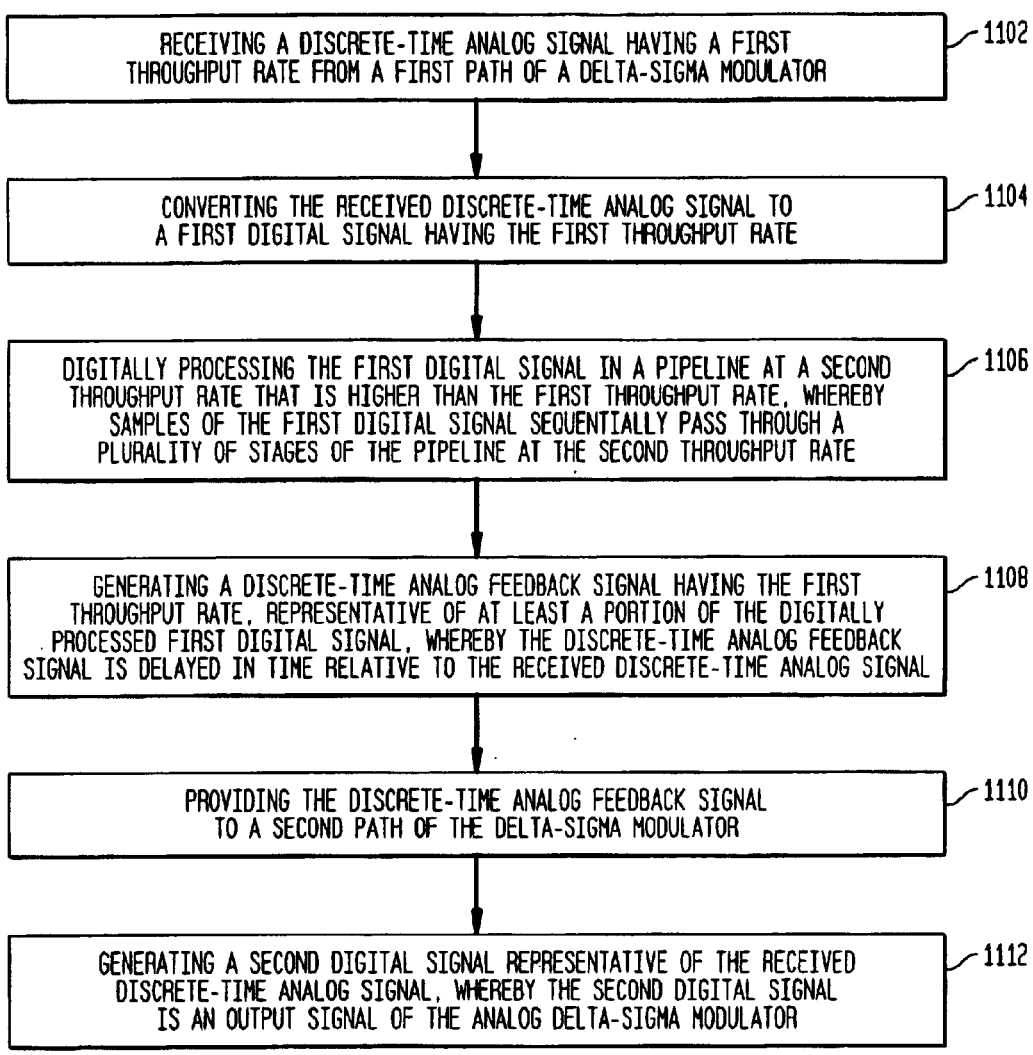
FIG. 11 illustrates a process flowchart for performing feedback processing in discrete-time analog delta-sigma modulators, wherein analog-to-digital conversion is performed at a lower rate and wherein digital signal processing is performed at a higher rate, in accordance with an aspect of the invention.

FIG. 11 illustrates a process flowchart 1100 for feedback processing in discrete-time analog delta-sigma modulators, wherein analog-to-digital conversion (e.g., the quantizer 104), is performed at a lower rate and wherein digital signal processing is performed at a higher rate. Digital-to-analog conversion is performed at either the lower or higher throughput rate. Operation of the flowchart 1100 is described with reference to FIG. 12.

The process begins at step 1102, receiving a discrete-time analog signal having a first throughput rate from a first path of a delta-sigma modulator. In FIG. 12, where the analog signal 1212 is a discrete-time analog signal, the quantizer circuitry 1204 receives the discrete-time analog signal 1212.

Step 1104 includes converting the received discrete-time analog signal to a first digital signal having the first throughput rate. In FIG. 12, the quantizer circuitry 1204 converts the discrete-time analog signal 1212 to a digital signal 1214*b*, having the lower rate of the discrete-time analog signal 1212. In an embodiment, the digital signal 1214*b* is a multi-bit digital signal. Alternatively, the digital signal 1214*b* is a single bit digital signal.

Step 1106 includes digitally processing the first digital signal in a pipeline at a second throughput rate that is higher than the first throughput rate, whereby samples of the first digital signal sequentially pass through a plurality of stages of the pipeline at the second throughput rate. In FIG. 12, the digital feedback circuitry 1206 digitally processes the digital signal 1214*b* at a higher rate than the quantizer circuitry 1204 output the digital signal 1214*b*. This is typically performed by over-sampling the digital signal 1214*b* at the higher rate, and processing each of the higher rate samples through the digital feedback circuitry 1206. The digital process(es) performed in the digital feedback circuitry 1206 are typically divided into sub-tasks, which are performed in sequential pipeline stages of the digital feedback circuitry 1206, at the higher rate.

In an embodiment, step 1106 includes applying digital dither to the digital signal 1214*b*. Methods and systems for applying digital dither are described in U.S. Pat. No. 6,577, 257, incorporated herein by reference in its entirety.

For example, in an embodiment, where the digital signal 1214*b* is an m-bit digital signal, step 1106 includes alternately outputting different sets of n-bits from the m-bit digital signal 1214*b* as a digitally dithered feedback signal. Alternatvely, step 1106 includes randomly selecting different sets of n-bits from the m-bit digital signal 1214*b* to output as a digitally dithered feedback signal. In these embodiments, m is greater than n. However, other embodiments use n greater than m.

In an embodiment, step 1106 includes processing the digital signal 1214*b* with a shuffler circuit and/or a dynamic element mismatch circuit, in addition to, or as an alternative to applying digital dither.

Step 1108 includes generating a discrete-time analog feedback signal having the first throughput rate, representative of at least a portion of the digitally processed first digital signal, whereby the discrete-time analog feedback signal is delayed in time relative to the received discrete-time analog signal. In FIG. 12, the feedback DAC 1208 outputs a discrete-time analog feedback signal 1220, having the first throughput rate. In the example of FIG. 12, the feedback DAC 1208 receives a lower rate digital feedback signal 1218, which is an under-sampled or decimated version of a higher rate digital signal 1216 from the digital feedback circuitry 1206. Alternatively, the feedback DAC 108 receives the higher rate digital signal 1216 and converts it to the lower rate discrete-time analog feedback signal 1220.

Step 1110 includes providing the discrete-time analog feedback signal to a second path of the delta-sigma modulator. In FIG. 12, the lower rate discrete-time analog feedback signal 1220 is provided to the input to the loop filter 1202. Alternatively, the lower rate discrete-time analog feedback signal 1220 is provided to another path of the delta-sigma modulator 1200.

Step 1112 includes generating a second digital signal representative of the received discrete-time analog signal, whereby the second digital signal is an output signal of the analog delta-sigma modulator. In FIG. 12, the delta-sigma modulator 1200 outputs one or more digital signals representative of the received discrete-time analog signal 1212. For example, in an embodiment, the delta-sigma modulator 1200 outputs the lower rate digital signal 1214*a*, the lower rate digital signal 1214*b*, and/or the lower rate digital feedback signal 1218. Alternatively, or additionally, the delta-sigma modulator 1200 outputs the higher rate digital feedback signal 1216 and/or a higher rate digital signal 1222. Alternatively, or additionally, the delta-sigma modulator 1200 generates the second digital signal from the first digital signal. Alternatively, or additionally, the delta-sigma modulator 1200 outputs a digital signal other than the digital signals described above.

FIG. 13 is a process flowchart for feedback processing in discrete-time analog delta-sigma modulators, wherein analog-to-digital conversion (e.g., the quantizer 104) and optional digital signal processing are performed at a higher throughput rate. Digital-to-analog conversion is performed at either the lower or higher throughput rate. Operation of the flowchart 1300 can be understood with reference to the description of the process flowchart 1100, and with reference to one or more of the block diagrams illustrated in FIGS. 1, 2, 3, 4, 5, and 12, and the corresponding description herein.

FIG. 14 is a process flowchart for feedback processing in continuous-time analog delta-sigma modulators, wherein analog-to-digital conversion (e.g., the quantizer 104), is implemented at a lower throughput rate and wherein digital signal processing is performed at a higher throughput rate. Operation of the flowchart 1400 can be understood with reference to the description of the process flowchart 1100, and with reference to one or more of the block diagrams illustrated in FIGS. 1, 2, 3, 4, 5, and 12, and the corresponding description herein.

VI. Conclusions

The present invention has been described above with the aid of functional building blocks illustrating the performance of specified functions and relationships thereof. The boundaries of these functional building blocks have been arbitrarily defined herein for the convenience of the description. Alternate boundaries can be defined so long as the specified functions and relationships thereof are appropriately performed. Any such alternate boundaries are thus within the scope and spirit of the claimed invention. One skilled in the art will recognize that these functional building blocks can be implemented by discrete components, application specific integrated circuits, processors executing appropriate software and the like or any combination thereof.

While various embodiments of the present invention have been described above, it should be understood that they have been presented by way of example only, and not limitation. Thus, the breadth and scope of the present invention should not be limited by any of the above-described exemplary embodiments, but should be defined only in accordance with the following claims and their equivalents.

What is claimed is:

1. A system for performing feedback processing of a discrete-time analog signal having a first throughput rate, said system comprising:
   (a) a quantizer circuit, wherein the discrete-time analog signal is received and converted to a first digital signal having the first throughput rate;
   (b) a digital feedback circuit having a plurality of pipeline stages, wherein the first digital signal is processed at a second throughput rate that is higher than the first throughput rate;
   (c) a feedback digital-to-analog converter, wherein a discrete-time analog feedback signal having the first throughput rate is generated and delayed in time relative to the received discrete-time analog signal; and
   (d) a loop filter, wherein the discrete-time analog feedback signal is provided to the quantizer.

2. The system of claim 1, wherein said first digital signal is a multi-bit digital signal.

3. The system of claim 1, wherein said digital feedback circuit applies digital dither to the first digital signal.

4. The system of claim 3, wherein the first digital signal is an m-bit digital signal and the digital feedback circuit outputs different sets of n-bits from the m-bit first digital signal as a digitally dithered feedback signal, where m is greater than n.

5. The system of claim 3, wherein the first digital signal is an m-bit digital signal and the digital feedback circuit randomly selects different sets of n-bits from the m-bit first digital signal to output as a digitally dithered feedback signal, where m is greater than n.

6. The system of claim 1, wherein said digital feedback circuit includes a shuffler circuit.

7. The system of claim 1, wherein said digital feedback circuit includes a dynamic element mismatch circuit.

8. A system for performing feedback processing, comprising:
   (a) a sampler, wherein a received continuous-time analog signal is sampled at a first throughput rate to generate a first discrete-time analog signal having the first throughput rate;
   (b) a quantizer circuit wherein the first discrete-time analog signal is converted to a first digital signal having the first throughput rate;
   (c) a digital feedback circuit having sequential pipeline stages, wherein the first digital signal is processed at a second throughput rate that is higher than the first throughput rate;
   (d) a feedback digital to analog converter, wherein a continuous-time analog feedback signal having the first throughput rate is generated and delayed in time relative to the received continuous-time analog signal; and
   (e) a loop filter, wherein the continuous-time analog feedback signal is provided to the quantizer circuit.

9. The system of claim 8, wherein the first digital signal is a multi-bit digital signal.

10. The system of claim 8, wherein the digital feedback circuit adds digital dither.

11. The system of claim 10, wherein the first digital signal is an m-bit digital signal and the digital feedback circuit outputs different sets of n-bits from the m-bit first digital signal as a digitally dithered feedback signal, where m is greater than n.

12. The system of claim 10, wherein the first digital signal is an m-bit digital signal and the digital feedback circuit randomly selects different sets of n-bits from the m-bit first digital signal to output as a digitally dithered feedback signal, where m is greater than n.

13. The system of claim 8, wherein said digital feedback circuit includes a shuffler circuit.

14. The system of claim 8, wherein said digital feedback circuit includes a dynamic element mismatch circuit.

15. A system for performing feedback processing of an analog signal, said system comprising:
   (a) a receiver configured to receive said analog signal at a first throughput rate;
   (b) a pipelined circuit configured to process said analog signal at a second throughput rate, wherein said second throughput rate is faster than said first throughput rate; and
   (c) an output path configured to output said processed signal.

16. The system of claim 15, wherein said pipelined circuit comprises a quantizer.

17. The system of claim 16, wherein said pipelined circuit further comprises digital feedback circuitry.

18. The system of claim 17, wherein said pipelined circuit further comprises feedback digital-to-analog converter circuitry.

19. The system of claim 15, wherein said pipelined circuit comprises digital feedback circuitry.

20. The system of claim 19, wherein said pipelined circuit further comprises feedback digital-to-analog converter circuitry.

* * * * *